(12) United States Patent
Kim et al.

(10) Patent No.: US 7,463,085 B2
(45) Date of Patent: Dec. 9, 2008

(54) TUNING CIRCUIT

(75) Inventors: Seyeob Kim, Gyeonggi-do (KR); Minsu Jeong, Gyeonggi-do (KR)

(73) Assignee: Integrant Technologies Inc., Gyeonggi-do (KR)

( * ) Notice: Subject to any disclaimer, the term of this patent is extended or adjusted under 35 U.S.C. 154(b) by 0 days.

(21) Appl. No.: 11/471,678

(22) Filed: Jun. 21, 2006

(65) Prior Publication Data

US 2006/0290419 A1  Dec. 28, 2006

(30) Foreign Application Priority Data

Jun. 22, 2005  (KR) ............... 10-2005-0053760

(51) Int. Cl.
*H03K 5/00*  (2006.01)
(52) U.S. Cl. ................................ 327/553; 327/552
(58) Field of Classification Search .......... 327/551–559
See application file for complete search history.

(56) References Cited

U.S. PATENT DOCUMENTS

| | | | |
|---|---|---|---|
| 6,577,114 B1* | 6/2003 | Roo ..................... | 324/76.28 |
| 6,842,710 B1* | 1/2005 | Gehring et al. ......... | 702/107 |
| 6,862,714 B2* | 3/2005 | Jin et al. ................ | 716/1 |
| 7,002,404 B2* | 2/2006 | Gaggl et al. ............ | 327/553 |
| 2004/0169565 A1 | 9/2004 | Gaggl et al. | |

FOREIGN PATENT DOCUMENTS

JP  2004-0169565  6/1992
JP  408122845 A *  5/1996

* cited by examiner

*Primary Examiner*—Dinh T. Le
(74) *Attorney, Agent, or Firm*—Foley & Lardner LLP

(57) ABSTRACT

The present invention relates to a filter and, more particularly, to a tuning circuit of a filter for correcting a cut-off frequency of the filter. The tuning circuit comprises a current generation unit having a first transistor and a variable resistor unit, and a capacitance correction unit having a second transistor, a capacitor unit, an up-down counter and a selection unit for selecting a control path of the up-down counter for varying the resistance or capacitance.

20 Claims, 8 Drawing Sheets to the first terminal, a current flowing at the variable
TUNING CIRCUIT

This Nonprovisional application claims priority under 35 U.S.C. § 119(a) on Patent Application No. 10-2005-0053760 filed in Korea on Jun. 22, 2005, the entire contents of which are hereby incorporated by reference.

BACKGROUND OF THE INVENTION

1. Field of the Invention

The present invention relates to a filter and, more particularly, to a tuning circuit of a filter for correcting a cut-off frequency of the filter.

2. Description of the Related Art

FIG. 1a shows a related art tuning circuit.

The tuning circuit as shown in FIG. 1a is disclosed in a U.S. Patent Laid Open Publication No. US 2004/0169565.

As shown in FIG. 1a, the tuning circuit comprises a filter unit 110, a comparator 120, and a controller unit 130.

The filter unit 110 comprises a first RC unit 111a, a second RC unit 111b, switches SW1a, SW1b, SW2a, and SW2b for charging and discharging the first and second RC units 111a and 111b, and a capacitor array 112 for controlling capacitance values of the first and second RC units 111a and 111b.

The comparator 120 compares two inputs (①and ②), and the controller unit 130 comprises a sequence controller 131 and a memory 132.

Herein, when a start signal is inputted to the sequence controller 131, the first and third switches SW1a and SW1b are turned on (close) according to a control signal (A) of an output terminal of the sequence controller 131. When a stop signal is inputted to the sequence controller 131, the second and fourth switches SW2a and SW2b are turned off (open) according to a control signal (B) of the output terminal of the sequence controller 131.

Although not shown, in order to perform a tuning operation, first, the first and third switches SW1a and SW1b should be turned on (close) and the second and fourth switches SW2a and SW2b should be turned off (open), so that the first capacitor (C1a) can be in a discharged state and the second capacitor (C1b) can be in a charged state.

After the proceeding process, when an input terminal start control signal of the sequence controller 131 is applied, the first and third switches SW1a and SW1b are turned off (open) and the second and fourth switches SW2a and SW2b are turned on (close), so that the first capacitor C1a is connected with a first resister R1a and gradually charged as time goes by and the second capacitor C1b is connected with a second resister R1b and gradually discharged as time goes by.

As the above process is performed, the comparator 120 compares a value of the first node (①) of the first RC unit 111a and the second node (②) of the second RC unit 111b.

Herein, upon comparing the values of the first and second nodes (① and ②), namely, the inputs to the comparator 120, if the output voltages of the first and second RC units 111a and 111b are reversed compared with an initial comparison state, the comparator 120 outputs a stop signal and the sequence controller 131 checks a corresponding time point and stores a clock time of a digital counter in the memory 132.

Resultantly, the first RC unit 111a has a first time constant (t1) and the second RC unit 111b has a second time constant (t2), and in this respect, the first and second capacitors C1a and C1b are controlled by the capacitor array 112 so that the first and second time constants t1 and t2 can become the same.

FIG. 1b is a graph for explaining the tuning operation of the related art tuning circuit. With reference to in FIG. 1b, as mentioned above with reference to FIG. 1a, the control signal (A) for starting tuning is turned off (open) and the control signal (B) is turned on (close), so that, at the start time point (tstart), the first RC unit starts to be charged while the second RC unit starts to be discharged.

Namely, the first time constant (t1) of the first RC unit is R1*C1 and the second time constant (t2) of the second RC unit is R2*C2.

As illustrated, time points at which the first and second RC units have the same charging and discharging change from Δt1 to Δt2 or to Δt3 at intersection nodes S1, S2, and S3 according to a device.

However, the related art method has the following problems. That is, because it does not use an external absolute reference that is not related to a change in PVT (Process, Voltage and Temperature), the tuned intersection nodes can be changed according to a change in the PVT.

In addition, since matching is performed according to a change in the first and second RC units, resultantly, tuning is made only at the intersection nodes S1, S2 or S3, so the tuning range is very narrow depending on a chip and every chip needs a tuning simulation.

SUMMARY OF THE INVENTION

The present invention has been made in an effort to provide a tuning circuit having advantages of compensating changed characteristics of a cut-off frequency caused as characteristics of a filter is changed by more than a certain range compared with characteristics of the filter set when the filter was initially designed.

The present invention has been also made in an effort to provide a tuning circuit having advantages of maximizing an effect of tuning by performing tuning at a period of a clock unrelated to an external change.

The present invention has been also made in an effort to provide a tuning circuit in which every chip has a uniform R*C value by performing tuning at a period of a clock unrelated to an external change regardless of a type of a chip.

The present invention has been also made in an effort to provide a tuning circuit in which every chip has a uniform R*C value although a driving clock of a chip is changed.

One exemplary embodiment of the present invention provides a tuning circuit comprising: a current generation unit which comprises a first transistor having three terminals and changing a current flowing from a second terminal to a third terminal in proportion to a voltage applied to a first terminal, and a variable resistor unit electrically connecting to the third terminal of the first transistor, a current flowing at the variable resistor unit being changed according to a resistance of the variable resistor unit; a capacitance correction unit which comprises a second transistor having three terminals and forming a current-mirror circuit together with the first transistor, in which the mirror-current flows from a fifth terminal to a sixth terminal in proportion to a voltage applied to a fourth terminal, and a variable capacitor unit connected with the sixth terminal of the second transistor; an up-down counter controlling to vary the resistance of the variable resistor unit or a capacitance of the variable capacitor unit.

Herein, the current generation unit may further comprise a first comparator comparing a voltage applied to both ends of the variable resistor unit and a reference voltage and an output of the first comparator is applied to the first terminal of the first transistor.

Herein, the variable resistor unit may comprise a switch-resistor bank structure in which one or more switch-resistor structures that a resistor and a switch are connected in series are coupled in parallel, and each switch of the switch-resistor bank is controlled by the up-down counter.

Herein, the capacitance correction unit may further comprise a second comparator comparing a voltage applied to both ends of the variable capacitor unit and a reference voltage and an output of the second comparator is applied to the up-down counter.

Herein, the variable capacitor unit may comprise a switch-capacitor bank structure in which one or more switch-capacitor structures that a capacitor and a switch are connected in series are coupled in parallel, and each switch of the switch-capacitor bank is controlled by the up-down counter.

Herein, the tuning circuit may further comprise a first switch connecting with the variable capacitor unit in parallel; a second switch connecting between the sixth terminal of the second transistor and the variable capacitor unit; a third switch applying a voltage of the variable capacitor unit to the second comparator; and a selection unit selecting an up-down counter control path for varying the resistance or the capacitance Herein, the first to third switches are controlled by clock signals, and when the first switch is turned on by a first clock signal, the second and third switches is sustained in an OFF state, when the second switch is turned on by a second clock signal, the first and third switches is sustained in an OFF state, and when the third switch is turned on by a third clock signal, the first and second switches is sustained in an OFF state Another exemplary embodiment of the present invention provides a tuning circuit comprising: a current generation unit which comprises a first transistor having three terminals and changing the current flowing from a second terminal to a third terminal in proportion to a voltage applied to a first terminal, and a resistor connected with the third terminal of the first transistor, the current flowing at the resistor being changed according to a resistance of the resistor; a capacitance correction unit which comprises a variable transistor unit having three terminals, forming a current-mirror circuit with the first transistor to allow a mirror current to flow from a fifth terminal to a sixth terminal in proportion to a voltage applied to a third terminal, and varying the mirror current according to an operation frequency, and a variable capacitor unit connected with the sixth terminal of the transistor unit; a up-down counter controlling to vary the mirror current of the variable transistor unit or the capacitance of the variable capacitor unit.

Herein, the current generation unit may further comprise a first comparator comparing a voltage applied to both ends of the resistor and a reference voltage and an output of the first comparator is applied to the first terminal of the first transistor Herein, the transistor unit may comprise a switch-transistor bank structure in which one or more switch-transistor structures that a switch and the second terminal of the transistor are connected in series are coupled in parallel, and each switch of the switch-transistor bank is controlled by the up-down counter.

Herein, the capacitance correction unit may further comprise a second comparator comparing a voltage of both ends of the variable capacitor unit and a reference voltage and an output of the second comparator is applied to the up-down counter.

Herein, the variable capacitor unit may comprise a switch-capacitor bank structure in which one or more switch-transistor structures that a capacitor and a switch are connected in series are coupled in parallel, and each switch of the switch-capacitor bank is controlled by the up-down counter.

Herein, the tuning circuit may further comprise: a first switch connecting with the variable capacitor unit in parallel; a second switch connecting between the sixth terminal of the second transistor and the variable capacitor unit; a third switch applying a voltage of the variable capacitor unit to the second comparator; and a selection unit selecting an up-down counter control path for varying the resistance or the capacitance.

Herein, the first to third switches are controlled by clock signals, and when the first switch is turned on by a first clock signal, the second and third switches is sustained in an OFF state, when the second switch is turned on by a second clock signal, the first and third switches is sustained in an OFF state, and when the third switch is turned on by a third clock signal, the first and second switches is sustained in an OFF state Details of other embodiments are included in the detailed description and drawings.

The foregoing and other objects, features, aspects and advantages of the present invention will become more apparent from the following detailed description of the present invention when taken in conjunction with the accompanying drawings. The present invention is not limited to the embodiments disclosed hereinafter and can be modified into various forms, and like reference numerals designate like elements throughout the specification.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIG. 1b is a graph for explaining a tuning operation of the related art tuning circuit in FIG. 1a.

DETAILED DESCRIPTION OF THE PREFERRED EMBODIMENT

The preferred embodiment of the present invention will be described in detail with reference to the accompanying drawings.

Figure 1A:
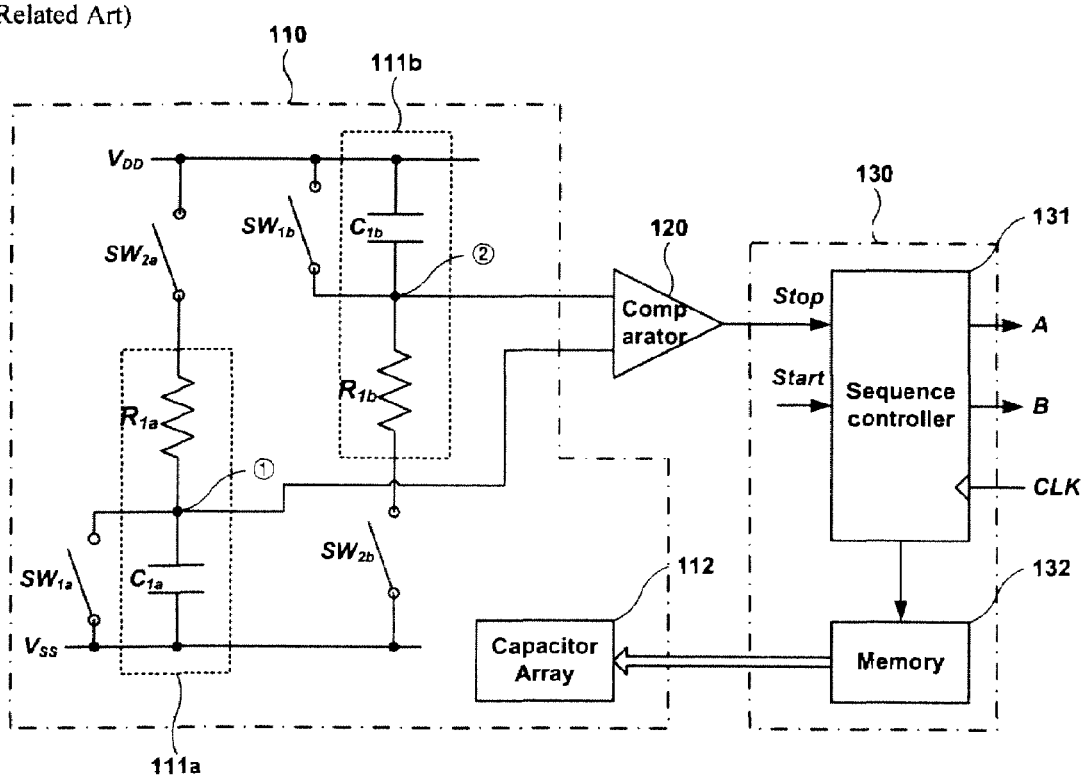
FIG. 1a is a circuit diagram showing a tuning circuit according to a related art.
Figure 1B:
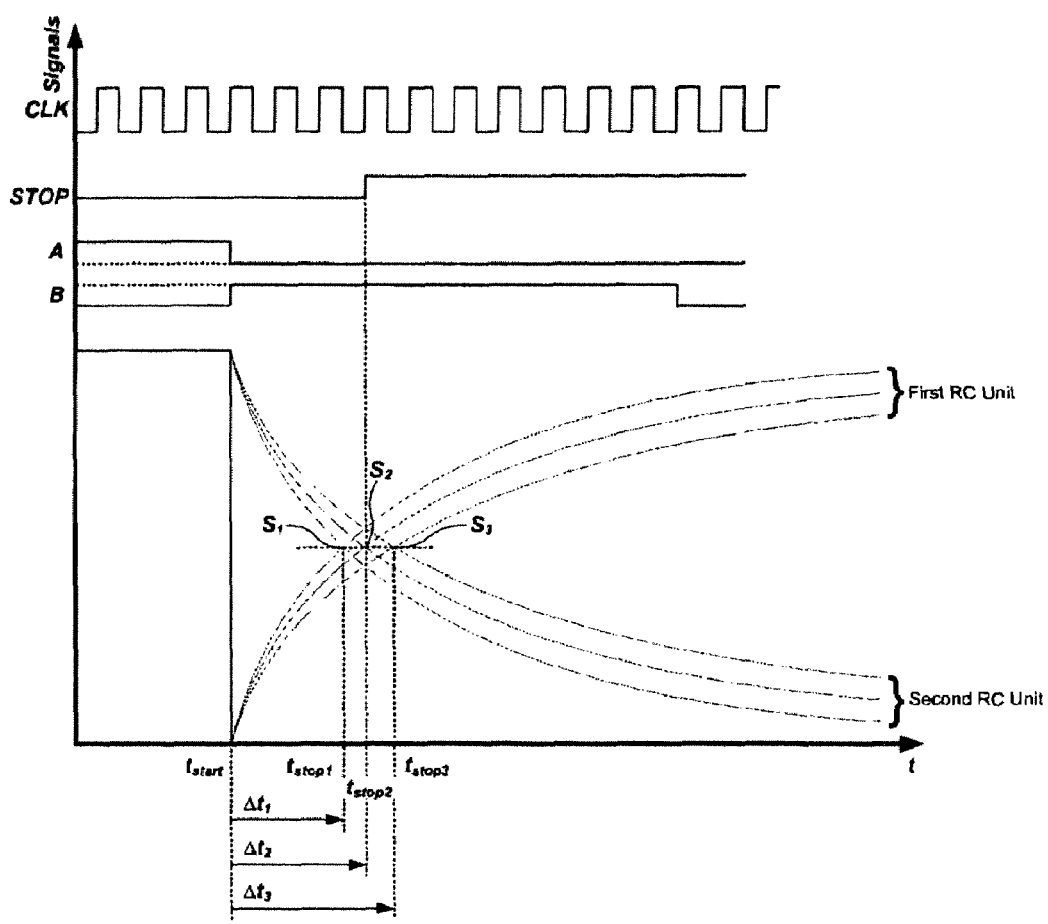
Figure 2A:
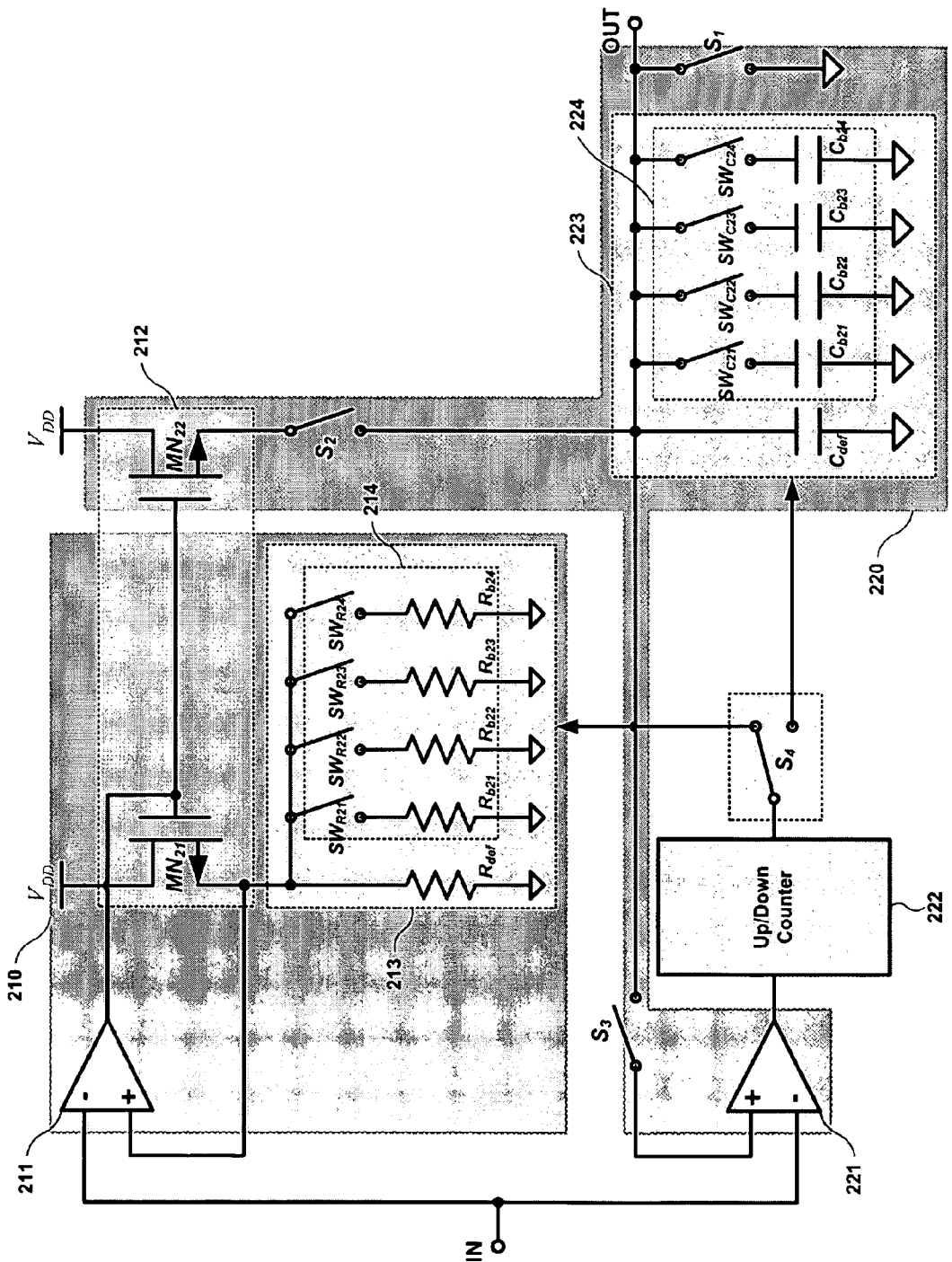
FIG. 2a is a view showing a tuning circuit diagram according to one embodiment of the present invention.

FIG. 2a is a circuit diagram showing a tuning circuit according to one embodiment of the present invention.

As shown in FIG. 2a, the tuning circuit comprises a current generation unit 210, a capacitance correction unit 220, an up-down counter 222, and a selection unit S4.

<Circuit Construction>

A current generation unit 210 comprises a first comparator 211, a first transistor MN21 and a resistor unit 213.

Herein, the resistor unit 213 comprises a basic resistor (Rdef) and a switch-resistor bank 214.

Herein, in the switch-resistor bank 214, one or more switch-resistor structures, in which resistor Rb21~Rb24 and switch SWR21~SWR24 are connected in series, are connected in parallel.

The capacitance correction unit 220 comprises a second comparator 221, a second transistor MN22, a capacitor unit 223, a first switch S1, a second switch S2 and a third switch S3.

Herein, the capacitor unit 223 includes a basic capacitor Cdef and a switch-capacitor bank 224.

Herein, in the switch-capacitor bank 224, one or more switch-capacitor structures, in which capacitor Cb21~Cb24 and switch SWC21~SWC24 are connected in series, are connected in parallel.

The up-down counter 222 switches the switches SWR21~SWR24 of the switch-resistor bank 214 or the switches SWC21~SWC24 of the switch-capacitor bank 224 according to a digital 4-bit control signal.

The selection unit S4 switches to transfer the digital 4-bit control signal of the up-down counter 222 to the switch-resistor bank 214 or the switch-capacitor bank 224.

<Connection Structure>

An input signal is applied to a negative (−) terminal of the first comparator 211, an output of the first comparator 211 is connected with a first terminal of the first transistor MN21, a voltage VDD is applied to a second terminal of the first transistor MN21, and a third terminal of the first transistor MN21 is connected with one end of the resistor unit 213 and a positive (+) terminal of the first comparator 211.

Herein, one end of the resistor unit 213 is connected with one end of the basic resistor Rdef and one end of the switch-resistor bank 214.

Herein, one end of the switch-resistor bank 214 is connected with one end of the switches SWR21~SWR24, the other end of the switches SWR21~SWR24 is connected with one end of the resistors Rb21~Rb24, ON/OFF switching of the switches SWR21~SWR24 is performed by a control signal of the up-down counter 222, and whether to form a circuit of the resistors Rb21~Rb24 is determined according to ON/OFF switching of the switches SWR21~SWR24.

An input signal is applied to a negative (−) terminal of the second comparator 221, an output of the second comparator 221 is inputted to the up-down counter 222, the first terminal of the first transistor MN21 and a first terminal of the second transistor MN22 are connected to form a current-mirror circuit 212, a voltage VDD is applied to a second terminal of the second transistor MN22, a third terminal of the second transistor MN22 is connected with one end of the second switch S2, the other end of the second switch S2 is connected with an output terminal (OUT), one end of the capacitor unit 223 and one end of the third switch S3, and the other end of the third switch S3 is connected with a positive (+) terminal of the second comparator 221.

Herein, an input terminal of the capacitor unit 223 is connected with one end of the basic capacitor Cdef and one end of the switch-capacitor bank 224.

Herein, one end of the switch-capacitor bank 224 is connected with one of the switches SWC21~SWC24, the other end of the switches SWC21~SWC24 is connected with one end of the capacitors Cb21~Cb24, ON/OFF switching of the switches SWC21~SWC24 is performed by a control signal of the up-down counter 222, and whether to activate the capacitors Cb21~Cb24 is determined according to ON/OFF switching of the switches SWC21~SWC24.

The output terminal (OUT) is connected with one end of the first switch S1.

Herein, an output of the up-down counter 222 is connected with an input terminal of the selection unit S4, a first output terminal of the selector S4 is connected to control the switch-resistor bank 214, and a second output terminal of the selection unit S4 is connected to control the switch-capacitor bank 224.

<Description of Operations>

When a reference voltage (Vref) is applied to an input terminal (IN), the first switch S1 is turned on (close), and after electric charges charged in the capacitor unit 223 are all discharged, the first switch S1 is turned off (open).

When the first switch S1 is turned off, the second switch S2 is simultaneously turned on, and at this time, the third switch S3 is in an initial OFF state without being switched, and the selection unit S4 is switched to the resistor unit 213.

The reference voltage (Vref) is applied to each negative (−) terminal of the first comparator 211 of the current generation unit 210 and the second comparator 221 of the capacitance correction unit 220, an output of the first comparator 211 is applied to the first terminal (gate) of the first transistor MN21, and an output of the second comparator 221 is applied to the input terminal of the up-down counter 222.

When the voltage VDD is applied to the second terminal (drain) of the first transistor MN21, the current (I) flows to the third terminal (source) of the first transistor MN21.

When the current (I) flows to the third terminal (source) of the first transistor MN21, it is applied to one end of the resistor unit 213 and a voltage generated by the current (I) is applied to the positive (+) terminal of the first comparator 211.

Herein, ON/OFF switching of the switches SWR21~SWR24 is performed by a control signal of the up-down counter 222, and whether to activate the resistors Rb21~Rb24 is determined according to the ON/OFF switching of the switches SWR21~SWR24.

Herein, in order to make description for the operations of the circuit simply, it is assumed that a total resistance is R(Ω).

The first comparator 211 compares the inputted reference voltage (Vref) and the voltage (I*R) generated as the current (I) flows at the resistor (R), and in order to remove the difference between the reference voltage (Vref) and the voltage (I*R) generated from the resistor (R), the first comparator 211 reduces or increases the current (I).

Herein, in order to increase or reduce the current (I), an amplifying operation of the first transistor MN21 is increased or decreased.

Herein, the tuning circuit has a variable structure so that resistance of the resistor unit 213 can be varied according to a clock applied to the tuning circuit, and in order to vary resistance of the resistor unit 213, the selection unit S4 is connected with the resistor unit 213.

Herein, the fact that the tuning circuit has the variable structure so that resistance of the resistor unit 213 can be varied means that the tuning circuit is constructed to perform a tuning operation at various frequencies. For example, when a clock applied to the tuning circuit is 4 MHz, a composite resistance value of the resistor unit 213 is 16 KΩ, when the clock is 16 MHz, the composite resistance value of the resistor unit 213 is 4 KΩ, when the clock is 16.384 MHz, the composite resistance value of the resistor unit 213 is 3.9 KΩ, and when the clock is 19.2 MHz, the composite resistance value of the resistor unit 213 is 3.3 KΩ.

That is, according to a difference of a voltage applied to the up-down counter 222, the up-down counter 222 controls the total resistance value for correcting a time constant according to a clock by switching the switch-resistor bank 214 to activate the resistors Rb21~Rb24.

After the total resistance value is set, the selection unit S4 is connected with the capacitor unit 223.

Then, a cut-off frequency (fc) has the properties that it is in inverse proportion to the product of the resistor (R) and the capacitor (C) and can be expressed by equation (1) shown below:

$$f_c \propto \frac{1}{RC} \qquad \text{[Equation 1]}$$

wherein fc is a cut-off frequency, 'R' is resistance, and 'C' is capacitance.

As for the current (I) generated by the current generation unit 210, owing to the current-mirror circuit 212, the current (I) having the same size as the current (I) flowing at the third terminal (source) of the first transistor MN21 flows at the third terminal (source) of the second transistor MN22 of the capacitance correction unit 220.

The thusly generated current (I) of the capacitance correction unit 220 flows to the input terminal of the capacitor 223.

Herein, ON/OFF switching of the switches SWC21~SWC24 is performed by the control signal of the up-down counter 222, and whether to activate the capacitors Cb21~Cb24 is determined according to the ON/OFF switching of the switches SWC21~SWC24.

Herein, in order to simplify describing of the operations of the circuit, a composite capacitance of the capacitor unit 223 is assumed as capacitance (C).

Herein, the voltage (Vout) generated from the composite capacitor can be expressed by equation (2) shown below:

$$V_{out} = \frac{Q}{C} = \frac{t \times I}{C} \qquad \text{[Equation 2]}$$

wherein Vout is an output voltage, 'Q' is an amount of charges, 'C' is capacitance of the capacitor unit, 'I' is the current flowing at the capacitor, and 't' is time during which the current flows at the capacitor.

The voltage (Vout), which is generated as the current (I) continuously flows to the capacitor during a certain time, is applied to the positive (+) terminal of the second comparator 221 of the capacitance correction unit 220 and the reference voltage Vref is applied to the negative (−) terminal.

An output of the second comparator 221 is applied to the up-down counter 222, and according to a difference of the voltage applied to the up-down counter 222, the up-down counter 222 controls a total capacitance value for correcting a time constant according to a clock by switching the switch-capacitor bank 214 to activate the capacitors Cb21~Cb24.

Herein, when the total capacitance of the capacitor unit 223 is 'C', since the current (I) is obtained by dividing the reference voltage Vref by the resistance (R), the voltage (Vout) can be expressed by equation (3) to equation (5) related to the time constant shown below:

$$V_{out} = \frac{t \times \frac{V_{ref}}{R}}{C} \qquad \text{[Equation 3]}$$

wherein because Vref should be equal to Vout, if the reference voltage Vref and the output voltage Vout are the same, the Vref can be expressed by equation (4) shown below:

$$V_{ref} = \frac{t \times \frac{V_{ref}}{R}}{C} \qquad \text{[Equation 4]}$$

Resultantly, equation (4) can be expressed by equation (5) shown below:

$$t = RC \qquad \text{[Equation 5]}$$

As a result, according to equation (5), when the reference voltage Vref and the output voltage (Vout) are the same, they can be obtained as a relational expression of 'R' and 'C' corresponding to the time constant of the filter, and in this case, the time constant of the filter can be corrected by changing the resistance (R) or the capacitance (C).

That is, regarding the input signal, the current generation unit 210 corrects the time constant of the cut-off frequency by changing the current flowing at the resistor (R) according to the variable resistance value (R), and the capacitance correction unit 220 corrects the time constant of the cut-off frequency by correcting the capacitance (C) based on the current generated from the current generation unit 210.

Consequently, the resistor can be constructed with a relatively larger capacity in a chip, but in case of the capacitor, because it takes much space when implemented in a chip, in order to correct the time constant, the resistance correction for covering a relatively larger coverage and the capacitance correction for correcting a fine time constant correction are performed.

In addition, in the present invention, a tuning time for correcting a change in the cut-off frequency of the filter is based on the t(variable R×C) and T (external clock period), and when the input voltage (IN), the comparison target of the comparators 211 and 221, and the voltage charged in the capacitor unit 223 are controlled to be the same, t(R×C)=T (external clock period), thereby performing tuning.

In this manner, a change between chips through tuning is a target for matching, and when t=T, it can be tuned to the clock period 'T', namely, an absolute external reference that is not related to the PVT (Process, Voltage and Temperature). Accordingly, any chip can be tuned to the clock period 'T', so every chip can have a uniform time constant.

Figure 2B:
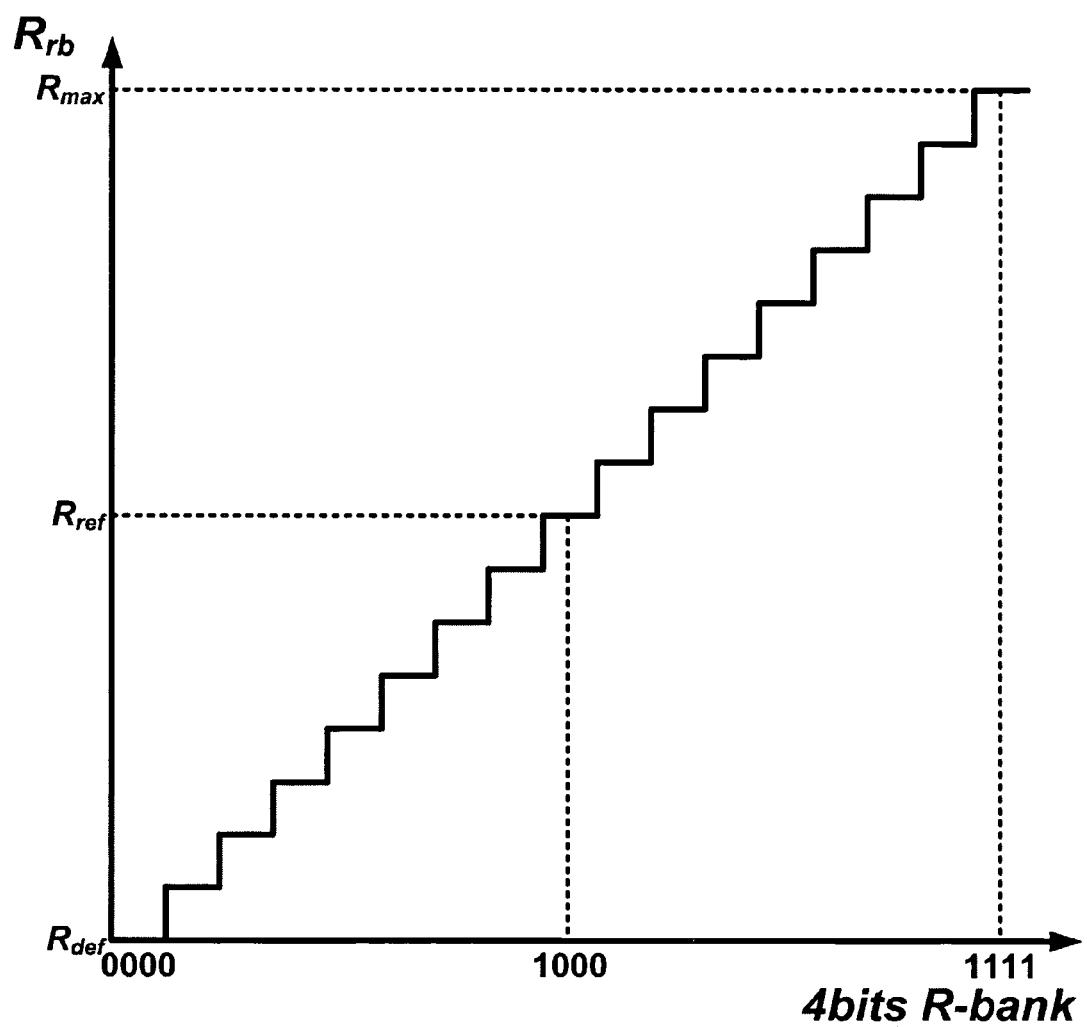
FIG. 2b is a graph showing a relationship between a control signal and capacitance according to controlling of switching of a switch-resistor bank of the tuning circuit for compensating a change in a cut-off frequency of a filter according to one embodiment of the present invention.

FIG. 2*b* is a graph showing the relationship between the control signal and the resistance according to controlling of switching of the switch-resistor bank of the tuning circuit for compensating a change in the cut-off frequency of the filter according to one embodiment of the present invention.

As shown in FIG. 2*b*, resistance is determined according to a control bit signal generated from the up-down counter 222.

A control bit signal [1000] of the 4-bit resistor unit is initially set as a reference resistance (Rref), and a control signal is generated to increase or decrease the resistance.

Figure 2C:
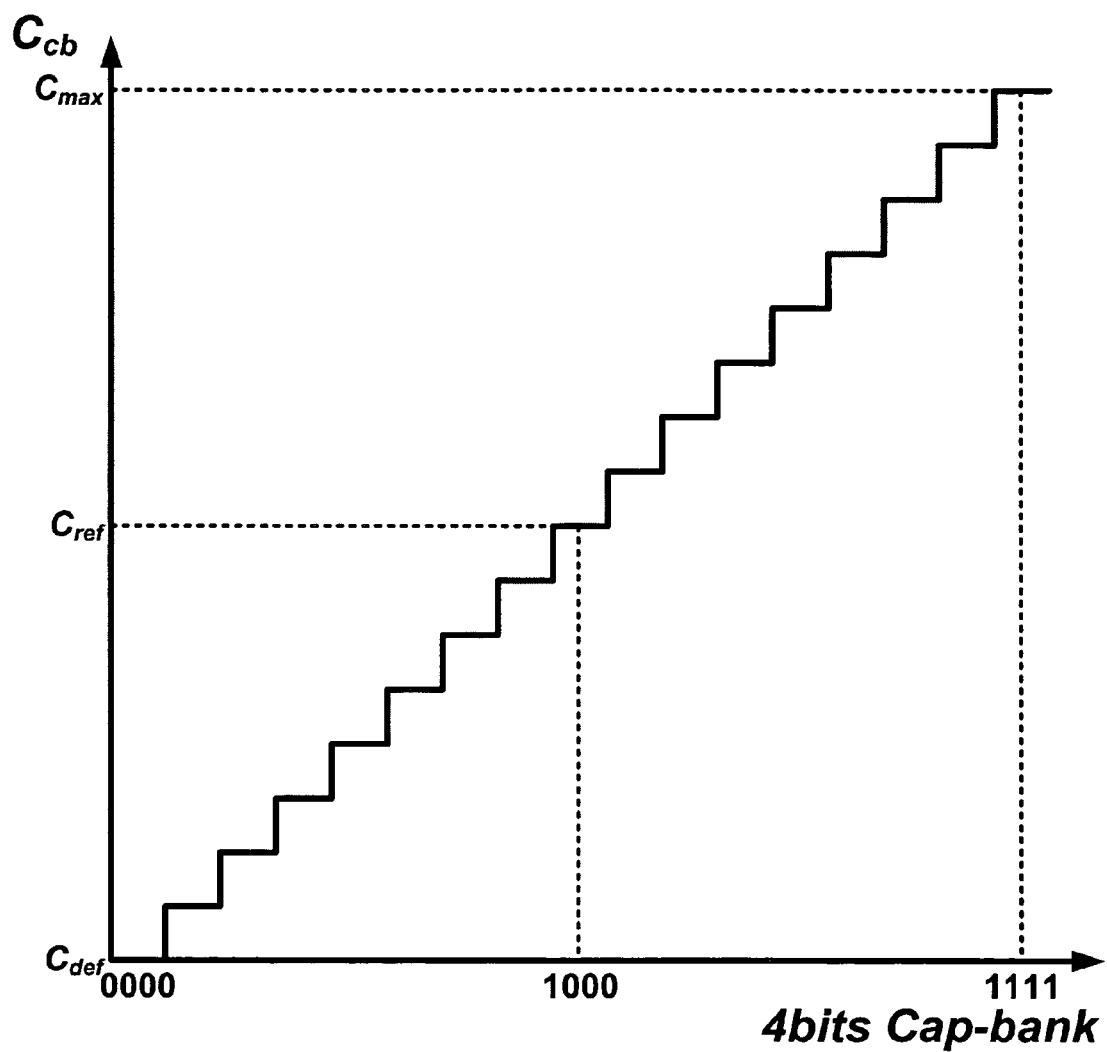
FIG. 2c is a graph showing a relationship between a control signal and capacitance according to controlling of switching of a switch-capacitor bank of the tuning circuit for compensating a change in the cut-off frequency of the filter according to one embodiment of the present invention.

FIG. 2c is a graph showing the relationship between the control signal and the capacitance according to controlling of switching of the switch-capacitor bank of the tuning circuit for compensating a change in the cut-off frequency of the filter according to one embodiment of the present invention.

As shown in FIG. 2c, capacitance is determined according to a control bit signal generated from the up-down counter 222. A control bit signal [1000] of the 4-bit capacitor unit is initially set as a reference capacitance (Cref), and a control signal is generated to increase or decrease the capacitance.

Figure 3A:
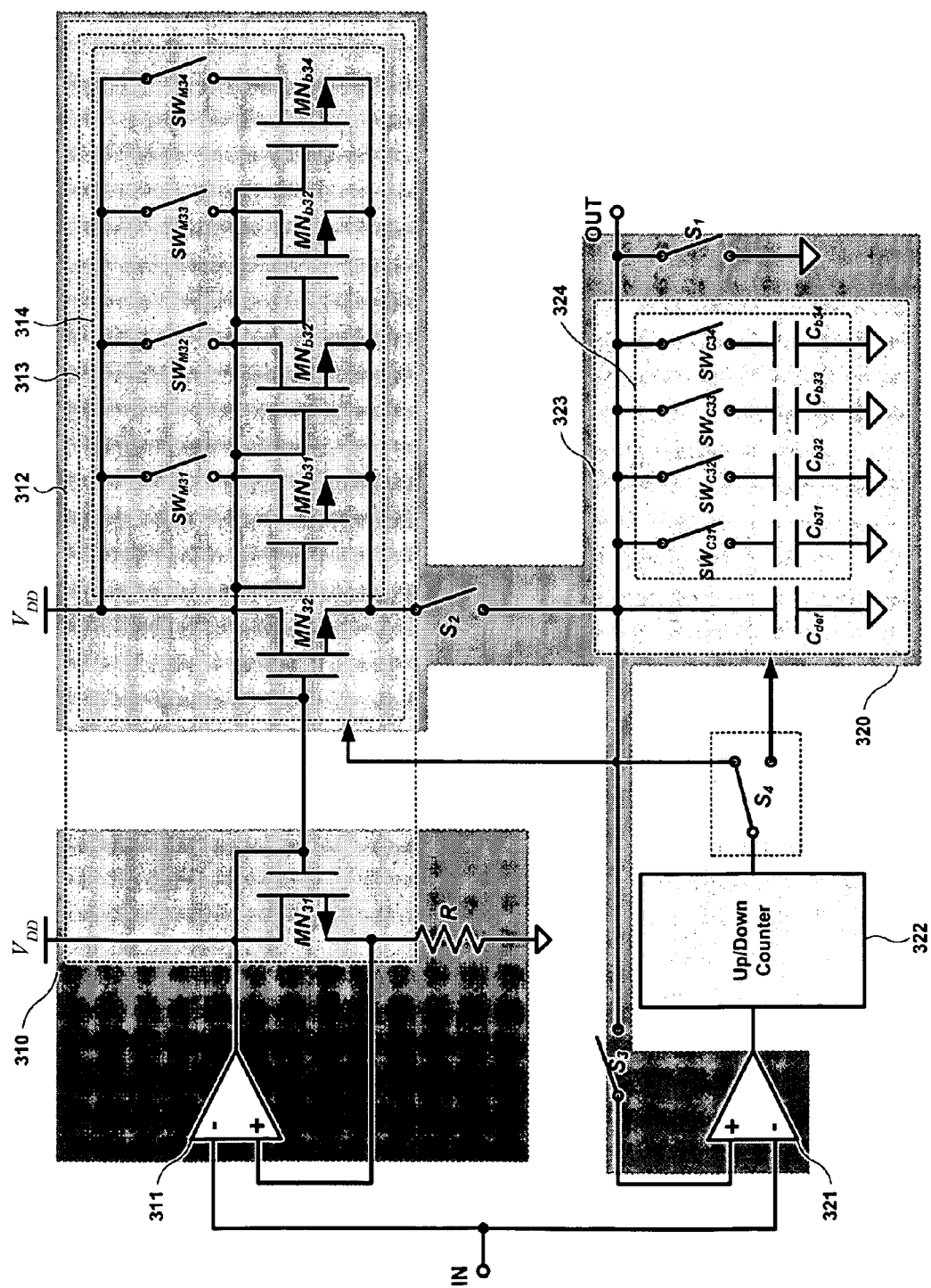
FIG. 3a is a view showing a circuit diagram of a tuning circuit for compensating a change in a cut-off frequency of a filter according to another embodiment of the present invention.

FIG. 3a is a view showing a circuit diagram of a tuning circuit for compensating a change in a cut-off frequency of a filter according to another embodiment of the present invention.

As shown in FIG. 3a, the tuning circuit comprises a current generation unit 310, a capacitor correction unit 320, an up-down counter 322, and a selection unit S4.

<Circuit Construction>

The current generation unit 310 comprises a first comparator 311, a first transistor MN31 and a resistor (R).

The capacitance correction unit 320 comprises a second comparator 321, a transistor unit 313, a capacitor unit 323, a first switch S1, a second switch S2, and a third switch S3.

Herein, the transistor unit 313 comprises a basic transistor MN32 and a switch-transistor bank 314.

Herein, in the switch-transistor bank 314, one or more switch-capacitor structures in which a switch SWM31~SWM34 is connected with a second terminal of a transistor MNb31~MNb34 are coupled in parallel.

The capacitor unit 323 comprises a basic capacitor Cdef and a switch-capacitor bank 324.

Herein, in the switch-capacitor bank 324, one or more switch-capacitor structures in which a capacitor Cb31~Cb34 and a switch SWC31~SWC34 are connected in series are connected in parallel.

The up-down counter 322 switches the switches SWM31~SWM34 of the switch-transistor bank 314 or the switches SWC31~SWC34 of the switch-capacitor bank 324 according to a digital 4-bit control signal.

The selection unit S4 switches to transfer the digital 4-bit of the up-down counter 322 to the switch-transistor bank 314 or the switch-capacitor bank 324.

<Connection Structure>

An input signal is applied to a negative (−) terminal of the first comparator 311, an output of the first comparator 311 is connected with a first terminal of the first transistor MN31, a voltage VDD is applied to a second terminal of the first transistor MN31, and a third terminal of the first transistor MN31 is connected with one end of the resistor (R) and a positive (+) terminal of the first comparator 311.

An input signal is applied to a negative (−) terminal of the second comparator 321, an output of the second comparator 321 is applied to the up-down counter 322, the first terminal of the first transistor MN31 and a first terminal of the transistor unit 313 are connected to form a current-mirror circuit 312, a voltage VDD is applied to a second terminal of the transistor unit 313, the other end of the transistor unit 313 is connected one end of the second switch S2, the other end of the second switch is connected with an output terminal (OUT), one end of the capacitor unit 323 and one end of the third switch S3, and the other end of the third switch S3 is connected with a positive (+) terminal of the second comparator 321.

Herein, the first terminal of the transistor unit 323 is connected with the first terminal of the basic transistor MN32 and the first terminal of the switch-transistor bank 324, the second terminal of the transistor unit 323 is connected with the second terminal of the basic transistor MN32 and the second terminal of the switch-transistor bank 324, and the third terminal of the transistor unit 323 is connected with the third terminal of the basic transistor MN32 and the third terminal of the switch-transistor bank 324.

Herein, the first terminal of the switch-transistor bank 324 is connected with the first terminal of transistors MNb31~MNb34, the second terminal of the switch-transistor bank 324 is connected with one end of the switches SWM31~SWM34, the other end of the switch SWM31~SWM34 is connected with the second terminal of the transistors MNb31~MNb34, the third terminal of the switch-transistor bank 324 is connected with the third terminal of the transistors MNb31~MNb34, ON/OFF switching of the switches SWM31~SWM34 is performed by the control signal of the up-down counter 322, and whether to amplify the transistors MNb31~MNb34 is determined according to the ON/OFF switching of the switches SWM31~SWM34.

Namely, the basic transistor MN32 and the transistors MNb31~MNb34 are coupled in parallel.

The input terminal of the capacitor unit 323 is connected with one end of the basic capacitor Cdef and one end of the switch-capacitor bank 324.

Herein, one end of the switch-capacitor bank 324 is connected with one end of the switches SWC31~SWC34, the other end of the switches SWC31~SWC34 is connected with one end of the capacitors Cb31~Cb34, ON/OFF switching of the switches SWC31~SWC34 is performed by the control signal of the up-down counter 322, and whether to activate the capacitors Cb31~Cb34 is determined according to ON/OFF switching of the switches SWC31~SWC34.

The output terminal (OUT) is connected with one end of the first switch S1.

Herein, an output of the up-down counter 322 is connected with an input terminal of the selection unit S4, a first output terminal of the selection unit S4 is connected to control the switch-transistor bank 314, and a second output terminal of the selection unit S4 is connected to control the switch-capacitor bank 324.

<Description of the Operation>

When a reference voltage (Vref) is applied to the input terminal (IN), the first switch S1 is turned on (close), and after electric charges charged in the capacitor unit 223 are all discharged, the first switch S1 is turned off (open).

When the first switch S1 is turned off, the second switch S2 is simultaneously turned on, and at this time, the third switch S3 is in an initial OFF state without being switched, and the selection unit S4 is switched to the transistor unit 313.

The reference voltage (Vref) is applied to each negative (−) terminal of the first comparator 311 of the current generation unit 310 and the second comparator 321 of the capacitance correction unit 220, an output of the first comparator 311 is applied to the first terminal (gate) of the first transistor MN31, and an output of the second comparator 321 is applied to the input terminal of the up-down counter 322.

When the voltage is applied to the second terminal (drain) of the first transistor MN31, the current (I) flows to the third terminal (source) of the first transistor MN31.

When the current (I) flows to the third terminal (source) of the first transistor MN31, it is applied to the the resistor (R) and the positive (+) terminal of the first comparator 311.

The first comparator 311 compares the inputted reference voltage (Vref) and the voltage (I*R) generated as the current (I) flows at the resistor (R), and in order to remove the difference between the reference voltage (Vref) and the voltage (I*R) generated from the resistor (R), the comparator 311 reduces or increases the current (I).

Herein, in order to increase or reduce the current (I), an amplifying operation of the first transistor MN31 is increased or decreased.

In this case, a cut-off frequency (fc) has the properties that it is in inverse proportion to the product of the resistor and the capacitor, and as for the current (I) generated by the current generation unit 210, owing to the current-mirror circuit 312, the current (I) having the same size as the current (I) flowing at the third terminal (source) of the first transistor MN31 flows at the third terminal of the transistor unit 313.

Herein, ON/OFF switching of the switches SWM31~SWM34 is performed by the control signal of the up-down counter 322, and whether to activate the transistors MNb31~MNb34 is determined according to the ON/OFF switching of the switches SWM31~SWM34.

Herein, the tuning circuit has a variable structure so that the current (I) of the transistor unit 313 can be varied according to a clock applied to the tuning circuit, and in order to vary the current of the transistor unit 313, the selection unit S4 is connected with the transistor unit 313.

That is, when clocks 4 MHz, 16 MHz, 16.384 MHz or 19.2 MHz are applied to the tuning circuit, in order to vary the size of the current (I) generated from the transistor unit 313, the up-down counter 322 varies the current (I) according to a voltage applied thereto to thereby control the current (I) to correct a time constant according to the clocks.

After such operations are performed, the selection unit S4 is connected with the capacitor unit 323, and the thusly generated current (I) of the capacitance correction unit 320 flows to the input terminal of the capacitor 323.

Herein, ON/OFF switching of the switches SWM31~SWM34 is performed by the control signal of the up-down counter 322, and whether to activate the capacitors Cb31~Cb34 is determined according to ON/OFF switching of the switches SWC31~SWC34.

Herein, in order to simplify describing of the operations of the circuit, a total capacitance of the capacitor unit 323 is assumed as capacitance (C).

The voltage (Vout), which is generated as the current (I) continuously flows to the capacitor during a certain time, is applied to the positive (+) terminal of the second comparator 321 and the reference voltage Vref is applied to the negative (−) terminal of the comparator 321.

An output of the second comparator 321 is applied to the up-down counter 322, and according to the voltage applied to the up-down counter 322, the up-down counter 322 controls a total capacitance value for correcting a time constant by varying the capacitance of the capacitor unit 323.

Because Vref should be equal to Vout, so if the reference voltage Vref and the output voltage Vout are the same, it can be obtained as a relational expression of 'R' and 'C' corresponding to the time constant of the filter, and in this case, the time constant of the filter can be corrected by varying the size of the current (I) applied to the capacitor or changing the capacitance (C).

That is, the capacitance correction unit 320 correct the time constant of the cut-off frequency by varying the current generated from the current-mirror circuit 312 based on the current generated from the current generation unit 310, and correcting the capacitance (C).

Namely, when the capacitor is implemented in a chip, it takes much space, making it difficult to cover a relatively large coverage to correct the time constant.

For these reasons, when the clock supplied to the chip is lowered, the switch-capacitor bank 324 of the capacitor unit 323 should perform fine tuning to reduce the current (I), and conversely, if the clock becomes high, the switch-capacitor bank 324 of the capacitor unit 323 should perform fine tuning to increase the current (I).

In addition, in the present invention, a tuning time for correcting a change in the cut-off frequency of the filter is based on the t(variable R×C) and T (external clock period), and when the input voltage (IN), the comparison target of the comparators 211 and 221, and the voltage charged in the capacitor unit 223 are controlled to be the same, t(R×C)=T (external clock period), thereby performing tuning.

In this manner, a change between chips through tuning is a target for matching, and when t=T, it can be tuned to the clock period 'T', namely, an absolute external reference that is not related to the PVT (Process, Voltage and Temperature). Accordingly, any chip can be tuned to the clock period 'T', so every chip can have a uniform time constant.

Figure 3B:
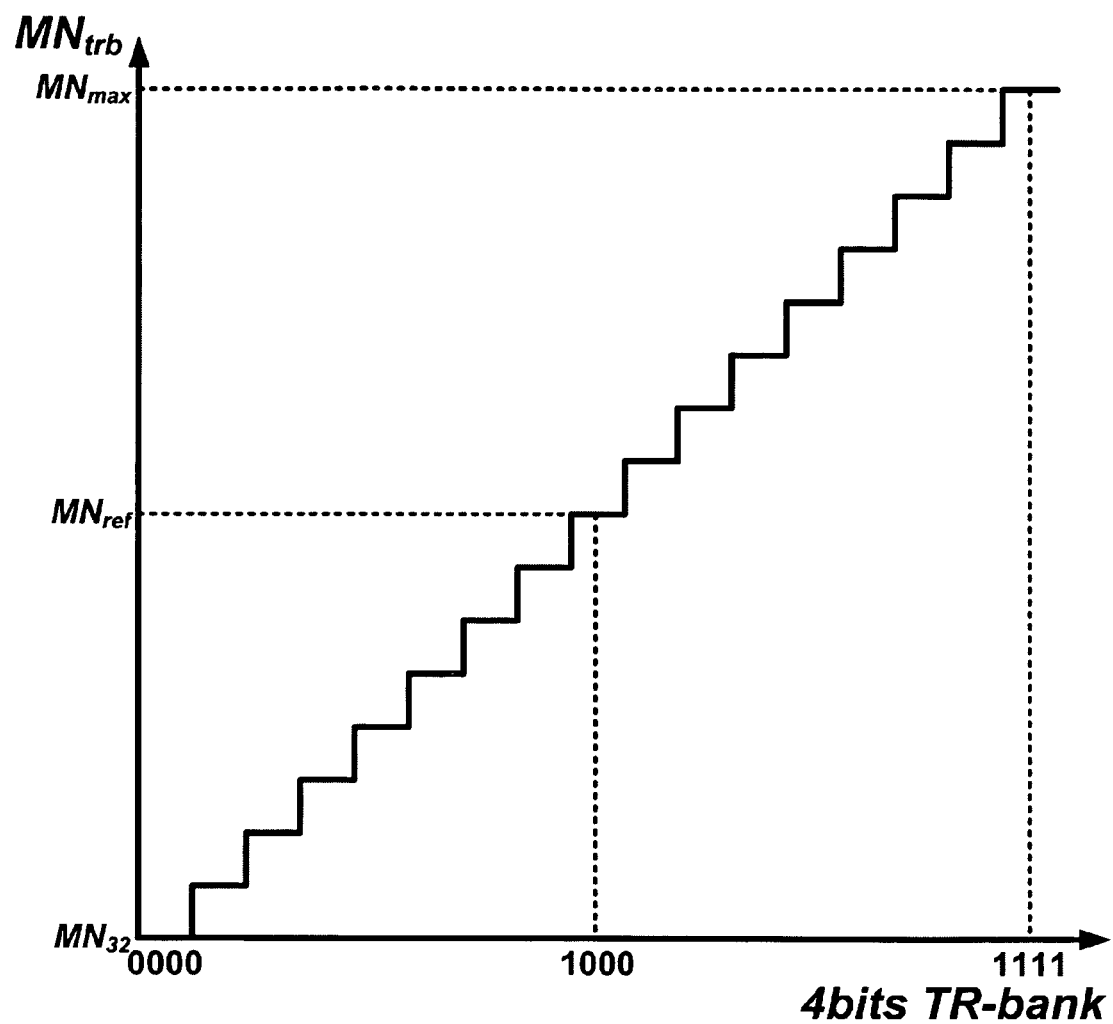
FIG. 3b is a graph showing a relationship between a control signal and a current size according to controlling of switching of a switch-transistor bank of the tuning circuit for compensating a change in a cut-off frequency of a filter according to another embodiment of the present invention.

FIG. 3b is a graph showing the relationship between the control signal and the size of the current according to controlling of switching of the switch-resistor bank of the tuning circuit for compensating a change in the cut-off frequency of the filter according to another embodiment of the present invention.

As shown in FIG. 3b, the size of the current is determined according to a control bit signal generated from the up-down counter. A control bit signal [1000] of the 4-bit transistor unit is initially set as the size of the current (MNref), and a control signal is generated to increase or decrease the size of the current.

Figure 3C:
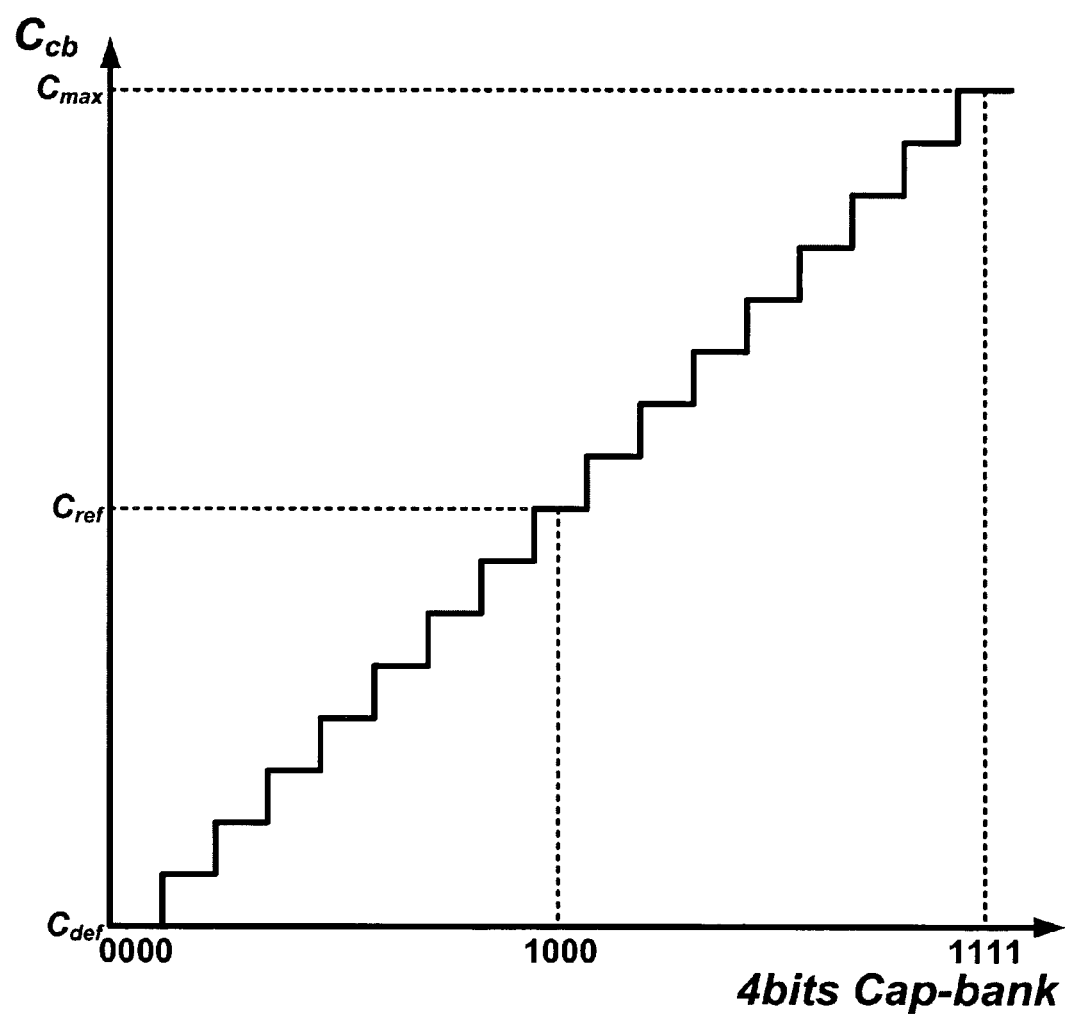
FIG. 3c is a graph showing a relationship between a control signal and capacitance according to controlling of switching of a switch-capacitor bank of the tuning circuit for compensating a change in the cut-off frequency of the filter according to another embodiment of the present invention.

FIG. 3c is a graph showing the relationship between the control signal and the capacitance according to controlling of switching of the switch-capacitor bank of the tuning circuit for compensating a change in the cut-off frequency of the filter according to another embodiment of the present invention.

As shown in FIG. 3c, capacitance is determined according to the control bit signal generated from the up-down counter 222. The control bit signal [1000] of the 4-bit capacitor unit is initially set as a reference capacitance (Cref), and a control signal is generated to increase or decrease the capacitance.

It will be apparent to those skilled in the art that various modifications and variation can be made in the present invention without departing from the spirit or scope of the invention. Therefore, it should be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

As described above, when the cut-off frequency is changed due to a change in the characteristics of the filter by more than a certain range compared with the characteristics of the filter set when the filter is initially designed, the changed characteristics of the filter can be compensated by using the tuning circuit.

In addition, because it can be tuned with the clock period that is not related to an external channel, the tuning effect can be maximized.

Moreover, because it can be tuned with the clock period that is not related to an external channel regardless of a type of a chip, every chip of the tuning circuit can have the uniform R*C value.

Furthermore, although the clock of the chip is changed, every chip of the tuning circuit can have the uniform R*C value.

What is claimed is:

1. A tuning circuit comprising:
a current generation unit comprising:
a first transistor having a first terminal, a second terminal, and a third terminal, said first transistor for changing a current flowing from the second terminal to the third terminal in proportion to a first voltage applied to the first terminal, and
a variable resistor unit with a variable resistance, said variable resistor unit electrically connected to the third terminal of the first transistor, a current flowing at the variable resistor unit changeable according to a resistance selected for the variable resistor unit; and
a capacitance correction unit comprising:
a second transistor having a fourth terminal, a fifth terminal, and a sixth terminal, said second transistor forming a current-mirror circuit together with the first transistor in which a mirror-current flows from the fifth terminal to the sixth terminal in proportion to a second voltage applied to the fourth terminal, and
a variable capacitor unit with a variable capacitance, said variable capacitor unit connected with the sixth terminal.

2. The tuning circuit of claim 1,
wherein the current generation unit further comprises a first comparator for comparing a voltage applied to the variable resistor unit and a reference voltage; and
wherein an output of the first comparator is applied to the first terminal of the first transistor.

3. The tuning circuit of claim 1,
wherein the variable resistor unit comprises a switch-resistor bank structure in which two or more switch-resistor structures, each with a resistor and a switch connected in series, are coupled in parallel, and
wherein each switch of the two or more switch-resistor structures of the switch-resistor bank is controlled by an up-down counter.

4. The tuning circuit of claim 1, further comprising:
an up-down counter for controlling a capacitance of the variable capacitor unit;
wherein the capacitance correction unit further comprises a comparator for comparing a voltage applied to the variable capacitor unit and a reference voltage; and
wherein an output of the comparator is applied to the up-down counter.

5. The tuning circuit of claim 1,
wherein the variable capacitor unit comprises a switch-capacitor bank structure in which two or more switch-capacitor structures, each with a capacitor and a switch connected in series, are coupled in parallel, and
wherein each switch of the two or more switch-capacitor structures of the switch- capacitor bank is controlled by an up-down counter.

6. The tuning circuit of claim 1, further comprising:
a first switch connecting with the variable capacitor unit in parallel;
a second switch connected between the sixth terminal of the second transistor and the variable capacitor unit;
a third switch for applying a voltage of the variable capacitor unit to a comparator; and
a selection unit for selecting an up-down counter control path from among at least two possible control paths to cause an output of an up-down counter to vary one of a resistance of the variable resistor unit and a capacitance of the variable capacitor unit.

7. The tuning circuit of claim 6,
wherein, when the first switch is turned on by a first clock signal, the second and third switches are sustained in an OFF state,
wherein, when the second switch is turned on by a second clock signal, the first and third switches are sustained in an OFF state, and
wherein, when the third switch is turned on by a third clock signal, the first and second switches are sustained in an OFF state.

8. The tuning circuit of claim 1, further comprising:
an up-down counter connected to at least one of said variable resistor unit and said variable capacitor unit, said up-down counter for controlling to vary the resistance of the variable resistor unit and the capacitance of the variable capacitor unit.

9. The tuning circuit of claim 8, further comprising:
a selection unit for connecting the up-down counter to a selected one of said variable resistor unit and said variable capacitor unit at a time.

10. The tuning circuit of claim 1,
wherein the second voltage is a same voltage as the first voltage.

11. A tuning circuit comprising:
a current generation unit comprising:
a first transistor having a first terminal, a second terminal, and a third terminal, said first transistor for changing a current flowing from the second terminal to the third terminal in proportion to a first voltage applied to the first terminal, and
a resistor connected with the third terminal of the first transistor, the current flowing at the resistor being changed according to a resistance of the resistor; and
a capacitance correction unit comprising:
a variable transistor unit having a fourth terminal, a fifth terminal, and a sixth terminal, said variable transistor unit forming a current-mirror circuit with the first transistor to allow a mirror current to flow from the fifth terminal to the sixth terminal in proportion to a second voltage applied to the fourth terminal, said variable transistor unit for varying the mirror current according to a selected configuration from among a plurality of selectable configurations of the variable transistor unit, and
a variable capacitor unit with a variable capacitance, said variable capacitor unit connected with the sixth terminal.

12. The tuning circuit of claim 11,
wherein the current generation unit further comprises a first comparator for comparing a voltage applied to the resistor and a reference voltage; and
wherein an output of the first comparator is applied to the first terminal of the first transistor.

13. The tuning circuit of claim 11,
wherein the variable transistor unit comprises a switch-transistor bank structure in which two or more switch-transistor structures, each with a switch and transistor connected in series, are coupled in parallel, and
wherein each switch of the two or more switch-transistor structures of the switch-transistor bank is controlled by an up-down counter.

14. The tuning circuit of claim 11, further comprising:
an up-down counter for controlling a capacitance of the variable capacitor unit;
wherein the capacitance correction unit further comprises a comparator for comparing a voltage supplied to the variable capacitor unit and a reference voltage; and wherein an output of the comparator is applied to the up-down counter.

15. The tuning circuit of claim 11, wherein the variable capacitor unit comprises a switch-capacitor bank structure in which two or more switch-transistor structures, each with a capacitor and a switch connected in series, are coupled in parallel, and wherein each switch of the two or more switch-transistor structures of the switch-capacitor bank is controlled by an up-down counter.

16. The tuning circuit of claim 11, further comprising:

a first switch connected with the variable capacitor unit in parallel;

a second switch connected between the sixth terminal of the second transistor and the variable capacitor unit;

a third switch for applying a voltage of the variable capacitor unit to a comparator; and a selection unit for selecting an up-down counter control path from among at least two possible control paths to cause an output of an up-down counter to vary one of a configuration of the variable transistor unit and a configuration of the variable capacitor unit.

17. The tuning circuit of claim 16, wherein, when the first switch is turned on by a first clock signal, the second and third switches are sustained in an OFF state, wherein, when the second switch is turned on by a second clock signal, the first and third switches are sustained in an OFF state, and wherein, when the third switch is turned on by a third clock signal, the first and second switches are sustained in an OFF state.

18. The tuning circuit of claim 11, further comprising:

an up-down counter connected to at least one of said variable transistor unit and said variable capacitor unit, said up-down counter for controlling to vary the mirror current supplied by the variable transistor unit and the capacitance of the variable capacitor unit.

19. The tuning circuit of claim 11, wherein the second voltage is a same voltage as the first voltage.

20. The tuning circuit of claim 11, said selected configuration of said variable transistor unit selected based on an operation frequency.

\* \* \* \* \*